(12) United States Patent
Tung et al.

(10) Patent No.: US 10,396,193 B2
(45) Date of Patent: Aug. 27, 2019

(54) III-NITRIDE HIGH ELECTRON MOBILITY TRANSISTOR

(71) Applicant: EPISTAR CORPORATION, Hsinchu (TW)

(72) Inventors: Chien-Kai Tung, Hsinchu (TW); Tien Ching Feng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/058,698

(22) Filed: Aug. 8, 2018

(65) Prior Publication Data

US 2019/0051741 A1    Feb. 14, 2019

(30) Foreign Application Priority Data

Aug. 8, 2017  (TW) .............................. 106126682 A (51) Int. Cl.
*H01L 29/66*  (2006.01)
*H01L 29/778*  (2006.01)
*H01L 29/417*  (2006.01)
*H01L 29/20*  (2006.01)
(Continued)

(52) U.S. Cl.
CPC .... *H01L 29/7787* (2013.01); *H01L 29/41758* (2013.01); *H01L 29/41775* (2013.01); *H01L 29/66462* (2013.01); *H01L 29/7786* (2013.01); *H01L 29/2003* (2013.01); *H01L 29/205* (2013.01); *H01L 29/42316* (2013.01)

(58) Field of Classification Search
CPC ... H01L 29/77; H01L 29/778; H01L 29/7786; H01L 29/7787; H01L 29/66; H01L 29/664; H01L 29/6646; H01L 29/66462; H01L 29/42; H01L 29/423; H01L 29/4231; H01L 29/42316; H01L 29/41; H01L 29/417; H01L 29/4175; H01L 29/41775; H01L 29/41758; H01L 29/20; H01L 29/20; H01L 29/205; H01L 29/2003
USPC ....................................................... 257/194
See application file for complete search history.

(56) References Cited

U.S. PATENT DOCUMENTS 9,543,291 B2 * 1/2017 Moens ............. H01L 29/66462
2016/0218205 A1   7/2016 Hsu et al.

FOREIGN PATENT DOCUMENTS

TW       201715915 A    5/2017

* cited by examiner

*Primary Examiner* — Monica D Harrison
(74) *Attorney, Agent, or Firm* — Ditthavong & Steiner, P.C.

(57) ABSTRACT

An III-nitride HEMT, including a substrate; a semiconductor epitaxial stack, formed on the substrate, including a buffer structure, a channel layer formed on the buffer structure and a barrier layer formed on the channel layer, wherein a two-dimensional electron gas is formed between the channel layer and the barrier layer; and a first electrode, a third electrode and a second electrode located in between, respectively formed on the barrier layer, wherein the semiconductor epitaxial stack includes a sheet resistance greater than 500 Ω/sq, wherein there is a first minimum space between the first electrode and the second electrode, a second minimum space between the second electrode and the third electrode, and the ratio of the first minimum space to the sum of first minimum space and the second minimum space is between 0.77 and 1, wherein the second electrode includes a length greater than or equal to 9 μm.

10 Claims, 8 Drawing Sheets

(51) Int. Cl.
*H01L 29/205* (2006.01)
*H01L 29/423* (2006.01)

| $L_{GD}$ (μm) | Breakdown voltage ($V_{BR}$) |
|---|---|
| 15 | 250 |
| 20 | 300 |
| 25 | 425 |
| 30 | 450 |
| 35 | 500 |
| 40 | 500 |

| $L_{GD}$ (μm) | $V_{DSS}$ (V) | $R_{DS(ON)}$ (Ω) |
|---|---|---|
| 15 | 5.5 | 50 |
| 20 | 6.5 | 58 |
| 25 | 7 | 64 |
| 30 | 8 | 70 |
| 35 | 8.5 | 78 |
| 40 | 9.5 | 85 |

| $L_G (\mu m)$ | $V_{DSS}(V)$ | $R_{DS(ON)}(\Omega)$ | $I_{DSS}(mA)$ |
|---|---|---|---|
| 3 | 10 | 85 | 72 |
| 4 | 9.5 | 85 | 66 |
| 5 | 9 | 87 | 64 |
| 7 | 8.5 | 87 | 60 |
| 9 | 6.5 | 89 | 48 |

III-NITRIDE HIGH ELECTRON MOBILITY TRANSISTOR

CROSS-REFERENCE TO RELATED APPLICATIONS

The present application claims the benefit of priority of TW Patent Application No. 106126682 filed on Aug. 8, 2017.

TECHNICAL FIELD

The present disclosure relates to a high electron mobility transistor (HEMT), in particular to an III-nitride HEMT with good current characteristics and high voltage resistance.

DESCRIPTION OF THE RELATED ART

In recent years, the demand for the products with high-power device has been increasing. The energy gap of gallium nitride (GaN) in the III-V semiconductor material is approximately 3.4 eV, and the thermal conductivity thereof is greater than 1.5 W/cm. GaN material is well suitable for high temperature and corrosion resistant environment because of the wide energy gap and high thermal conductivity thereof. In addition, because the breakdown electric field of the GaN material is $3 \times 10^6$ V/cm and the carrier-transport speed thereof reaches $3 \times 10^7$ cm/s, the GaN material is suitable for a high-power device that can sustain under high operating voltage. Therefore, because a nitride semiconductor power device based on GaN material, such as AlGaN/GaN HEMT, includes advantages, such as high electron mobility, fast switching, and operating in high power and high temperature environment, it is widely used in power supply, DC/DC converters, or AC/DC inverters, which are used in electronic products, uninterruptable power systems (UPS), automobiles, motors, and wind power generations.

Figure 1:
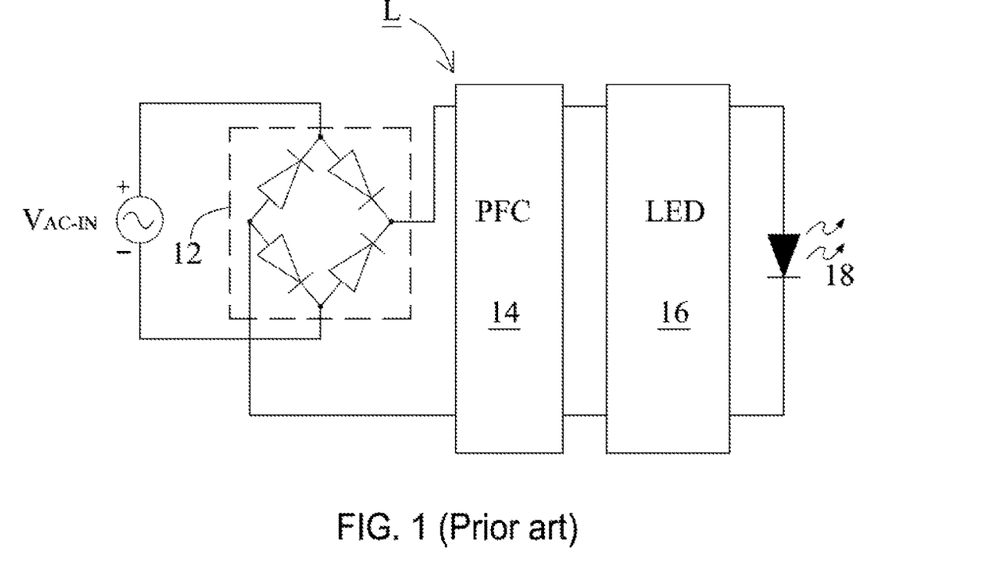
FIG. 1 shows a circuit of conventional lighting system.

FIG. 1 shows a circuit L of conventional light-emitting diode (LED) lighting system, including a bridge rectifier 12, a power factor corrector (PFC) 14, an LED driving circuit 16, and an LED 18. The power factor corrector 14 can be a booster, and the LED driving circuit 16 can be a buck converter. The LED driving circuit 16 is mostly made of a silicon-based material and therefore not a high-voltage-resistance device. It needs to include a protection circuit and many passive components, such as an inductance component, making the LED driving circuit 16 bulky and expensive as a whole.

Figure 2:
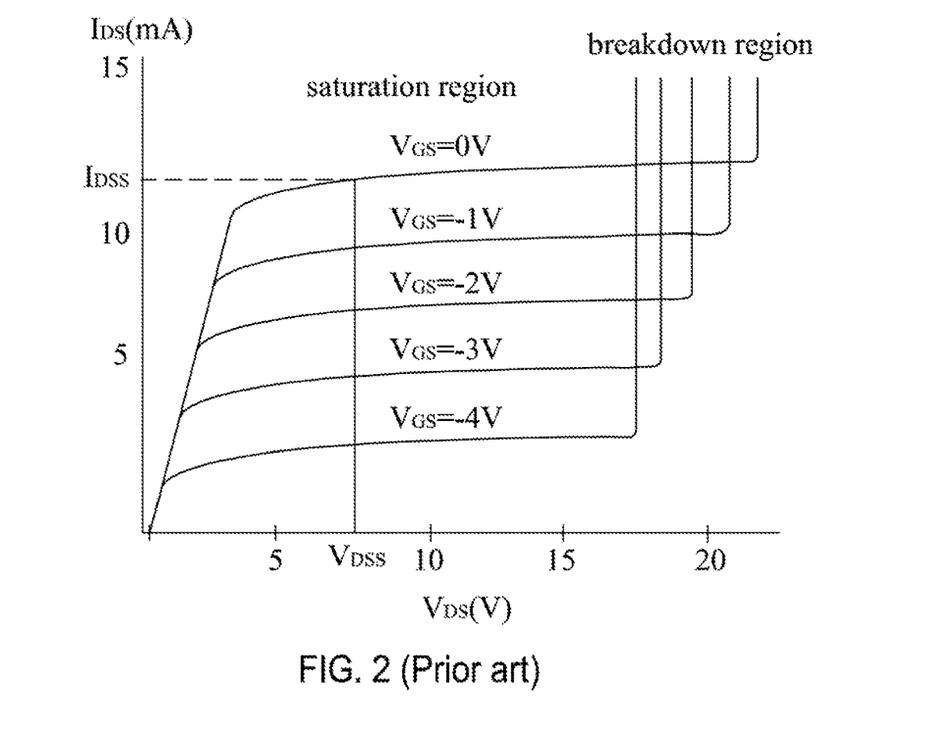
FIG. 2 shows a current-voltage curve of a conventional silicon-based transistor, which shows the variation of the drain-source current $I_{DS}$ with the drain-source voltage $V_{DS}$.

FIG. 2 is a voltage-current curve diagram of a conventional silicon-based transistor, which shows the variation of the drain-source current $I_{DS}$ with the drain-source voltage $V_{DS}$ when different gate-source voltages $V_{GS}$, such as 0V, −1V, −2V, −3V and −4V, are applied. When adopting the conventional silicon-based transistor, the LED driver circuit 16 is operated in a saturated region beyond the saturation voltage $V_{DSS}$. In this region, the drain-source current $I_{DS}$ of the silicon-based transistor is more stable than that before the saturation voltage, and is referred to as saturation current $I_{DSS}$. However, in the saturated region, the drain-source current $I_{DS}$ continues to increase as the drain-source voltage $V_{DS}$ increases. At this time, the LED driving circuit 16 is difficult to be operated under constant power. In addition, as shown in the breakdown region of FIG. 2, the breakdown voltage of the silicon-based transistor is approximately 15 to 25 volts, indicating that the silicon-based transistor is broken when being operated under a higher voltage. Therefore, the range of the saturation voltage $V_{DSS}$ of the silicon-based transistor is limited.

SUMMARY OF THE DISCLOSURE

An III-nitride high electron mobility transistor (HEMT) includes a substrate; a semiconductor epitaxial stack, formed on the substrate, including a buffer structure, a channel layer formed on the buffer structure and a barrier layer formed on the channel layer, wherein a two-dimensional electron gas is formed between the channel layer and the barrier layer; and a first electrode, a second electrode and a third electrode, respectively formed on the barrier layer, wherein the second electrode is located between the first electrode and the third electrode; wherein the semiconductor epitaxial stack includes a sheet resistance greater than 500 Ω/sq; wherein there is a first minimum space between the first electrode and the second electrode, a second minimum space between the second electrode and the third electrode, and the first minimum space and the sum of the first minimum space and the second minimum space includes a ratio greater than or equal to 0.77 and less than 1; wherein the second electrode includes a length greater than or equal to 9 μm.

In order to clearly and easily understand the above and other objects, features, and advantages of the present disclosure, the following detailed description, in conjunction with the accompanying drawings, are described in detail as follow.

DETAILED DESCRIPTION OF THE EMBODIMENTS

The following embodiments, in conjunction with the accompanying drawings, will illustrate the concept of the present disclosure. In the drawings or the description, similar or identical portions are denoted by the same reference numerals, and in the drawings, the shape or thickness of the elements can be enlarged or reduced. Particularly, elements not shown or described in the drawings can be known to those skilled in the art.

Figure 3:
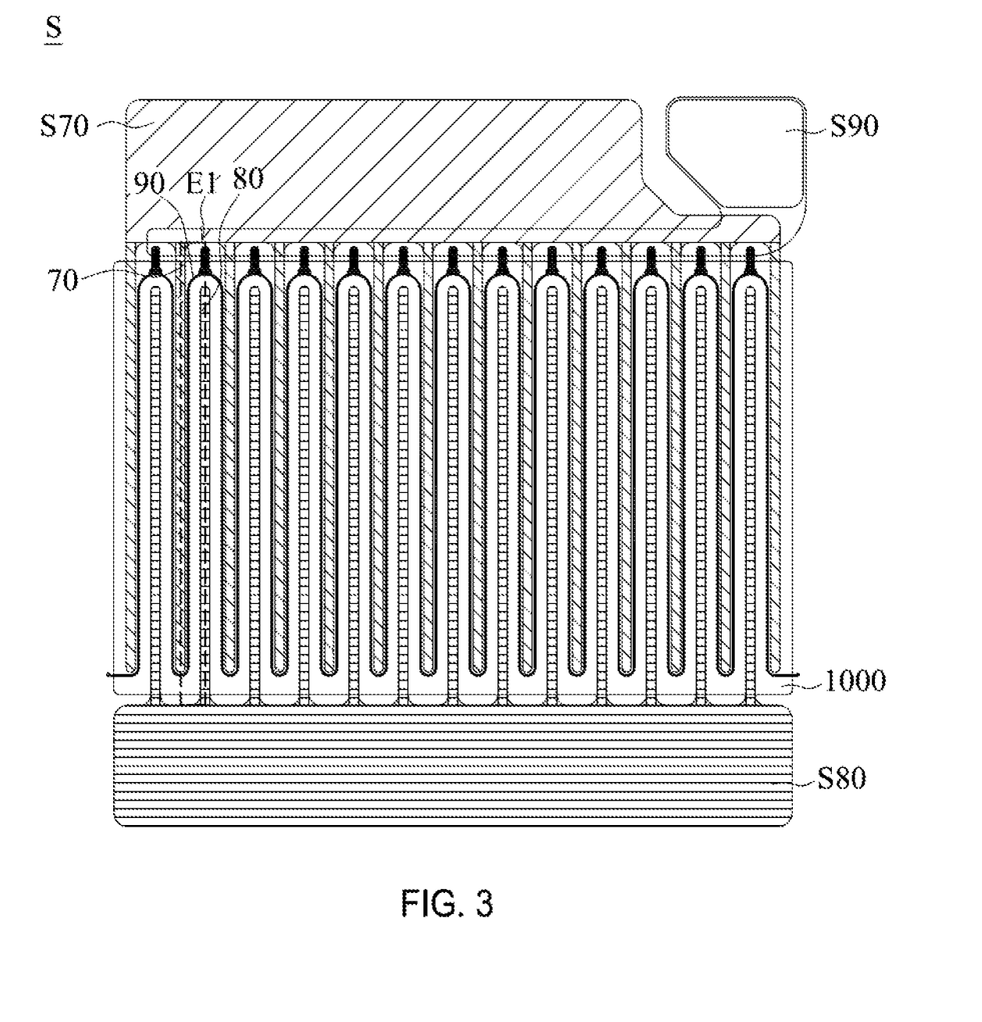
FIG. 3 shows a top view of a III-nitride HEMT in accordance with the first embodiment of the present disclosure.

Referring to FIG. 3, which shows a top view of a III-nitride HEMT S in accordance with the first embodiment of the present disclosure. The III-nitride HEMT S is a three-terminal structure. In the embodiment, the III-nitride HEMT S includes a source pad S70, a drain pad S80, a gate pad S90, and one III-nitride HEMT unit E1. The III-nitride HEMT unit E1 includes a source electrode 70 electrically connected to the source pad S70, a drain electrode 80 electrically connected to the drain pad S80, a gate electrodes 90 electrically connected to the gate pad S90, and a semiconductor epitaxial stack 1000. The materials, thickness, and composition of the layers in the semiconductor epitaxial stack 1000 can be adjusted according to actual needs. In addition, the III-nitride HEMT unit E1 included in the III-nitride HEMT S can also be replaced with the III-nitride HEMT unit disclosed by other embodiments of the present disclosure.

Figure 4A:
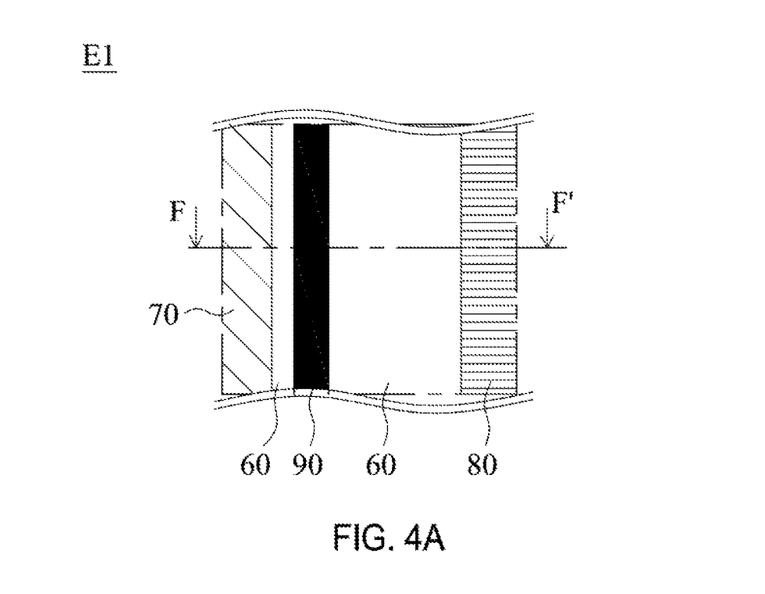
FIG. 4A shows a partial enlarged top view of the III-nitride HEMT unit in accordance with the first embodiment of the present disclosure.
Figure 4B:
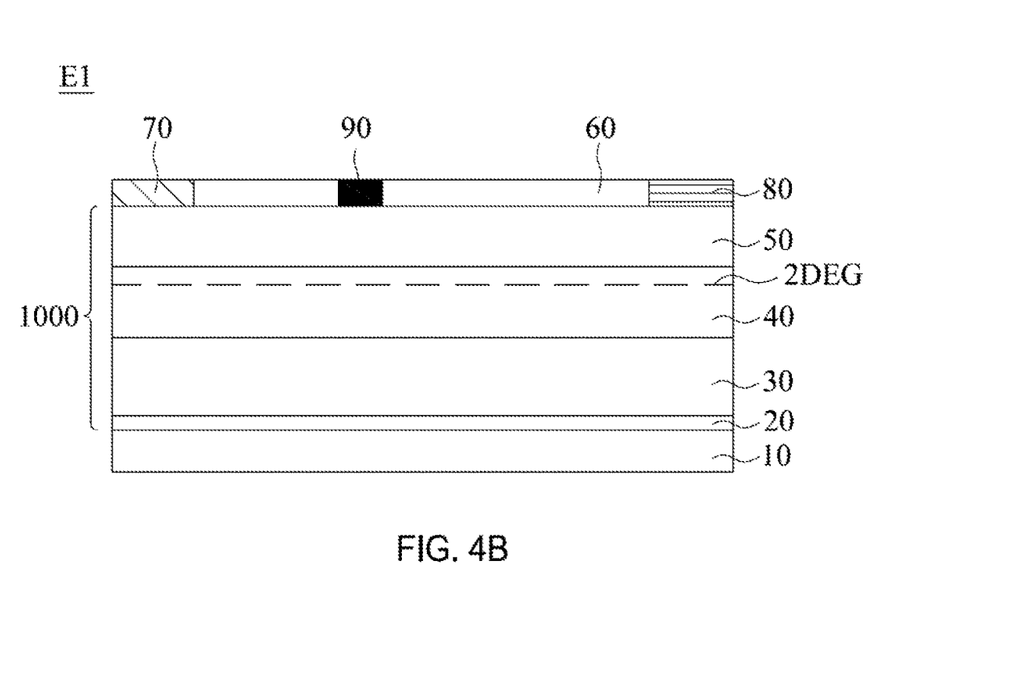
FIG. 4B shows a cross-sectional view taken along the line FF' in FIG. 4A.

FIGS. 4A and 4B show a detailed structure of the III-nitride HEMT unit E1 in accordance with the first embodiment of the present disclosure. FIG. 4A shows a partial enlarged top view of the III-nitride HEMT unit E1 shown in FIG. 3, and FIG. 4B shows a cross-sectional view taken along the line FF' in FIG. 4A. The III-nitride HEMT S is composed of a plurality of III-nitride HEMT units E1. The III-nitride HEMT unit E1 such as a normally-on HEMT unit includes a substrate 10, a semiconductor epitaxial stack 1000 which includes a nucleation layer 20, a buffer structure 30, a channel layer 40 and a barrier layer 50, a source electrode 70, a drain electrode 80, a gate electrode 90, and a protective layer 60. The layers of the semiconductor epitaxial stack 1000 are not limited to the abovementioned. The semiconductor epitaxial stack 1000 is defined as an epitaxial stack between the substrate 10 and the gate electrode 90, and includes the channel layer 30 and the barrier layer 40. The nucleation layer 20 and the buffer structure 30 are sequentially formed on the substrate 10. The channel layer 40 formed on the buffer structure 30 has a first energy gap. The barrier layer 50 formed on the channel layer 40 has a second energy gap greater than the first energy gap. A two-dimensional electron gas (2DEG) is formed between the channel layer 30 and the barrier layer 40. The source electrode 70, the drain electrode 80 and the gate electrode 90 are formed on the barrier layer 50, respectively, and the gate electrode 90 is located between the source electrode 70 and the drain electrode 80. The protective layer 60 is optionally formed on the surface of the barrier layer 5 not covered by the source electrode 70, the drain electrode 80, and the gate electrode 90. In addition, the protective layer 60 can be optionally formed under the gate electrode 90 (not shown). By selecting the protective layer 60 with different dielectric constant and/or adjusting the thickness of the protective layer 60, the total surface leakage current of the III-nitride HEMT unit E1 can be further reduced and the range of the operating bias applied to the gate electrode 90 can be changed.

The material of the substrate 10 includes a semiconductor material or an oxide material. The semiconductor material includes silicon (Si), gallium nitride (GaN), silicon carbide (SiC), gallium arsenide (GaAs), and the like. The oxide material includes sapphire. In the embodiment, a silicon substrate is used. An aluminum nitride (AlN) nucleation layer 20 is formed on the (111) surface and along the [0001] direction of the Si substrate 10. In addition, when classified by conductivity, the substrate 10 can be a conductive substrate or an insulative substrate. The conductive substrate includes Si substrate, GaN substrate, GaAs substrate, and the like. The insulative substrate includes sapphire substrate, silicon on insulator (SOI) substrate, and the like. In addition, the substrate 10 can be selectively doped with the dopants to change its conductivity to form a conductive substrate or a non-conductive substrate. For the Si substrate, the dopants can be boron (B), arsenic (As), or phosphorus (P). In the embodiment, the substrate 10 is a conductive Si substrate with a thickness of about 1000-1200 μm.

Next, the nucleation layer 20 is epitaxially grown on the (111) surface and along the [0001] direction of the substrate 10, and the thickness thereof can be about dozens of nanometers or hundreds of nanometers. The nucleation layer 20 can reduce the lattice mismatch between the substrate 10 and the semiconductor layer formed thereon. The epitaxial growth methods include physical vapor deposition (PVD), atomic layer deposition (ALD), metal-organic chemical vapor deposition (MOCVD) or molecular-beam epitaxy (MBE). With the nucleation layer 20, the epitaxial quality of the semiconductor layer such as the buffer structure 30 and the channel layer 40 subsequently formed thereon can be better. The material of the nucleation layer 20 includes III-V semiconductor material, such as aluminum nitride (AlN), gallium nitride (GaN), aluminum gallium nitride (AlGaN) and the like. The nucleation layer 20 can be an epitaxial layer composed of the mentioned material, or a stack composed of the epitaxial layers repeating or mixing with each other. The structure of the nucleation layer 20 can be amorphous structure, polycrystalline structure, single crystal structure, or mixed structure of crystalline gradation. In the embodiment, the nucleation layer 20 is an AlN layer with a thickness of about 50-200 nm, and formed by PVD method, and more specifically, a sputtering method.

After the nucleation layer 20 is formed, the buffer structure 30 is formed on the nucleation layer 20 in an epitaxial manner similar to the foregoing. The buffer structure 30 allows the channel layer 40 and the barrier layer 50 subsequently formed thereon to have a better epitaxial quality, and the thickness thereof is about 1 μm~10 μm. The buffer structure 30 can include a single layer or multiple layers. When the buffer structure 30 includes multiple layers, a super-lattice stack or an alternating stack of two or more layers with different materials can be included. The material of the single-layer or multiple-layer buffer structure 30 include a III-V semiconductor material such as AlN, GaN, or AlGaN, and can be doped therein with other elements such as carbon (C) or iron (Fe), wherein the doping concentration can be graded or fixed along the growth direction. In addition, when the buffer structure 30 include a super-lattice stack, it can be a multi-layer epitaxial stack of two layers with different materials alternately stacked, which includes III-V semiconductor materials, such as AlN layer/AlGaN layer alternately stacked or GaN/InGaN alternately stacked. The thickness of the AlN layer and the AlGaN layer is about 2 nm~30 nm, and the total thickness of the stack is about 1 μm~9 μm. The AlN and the AlGaN layer in the stack can be replaced by the GaN layer and the InGaN layer. In the embodiment, the buffer structure 30 includes a super-lattice stack of the AlN layer with a thickness of 5 nm and the AlGaN layer with a thickness of 20 nm alternately stacked 80 times, wherein the an average aluminum content of the super-lattice stack is 20%. A carbon-doped GaN buffer can be formed on the super-lattice stack, wherein the concentration of the carbon doping is 1E18 counts/cm$^3$ measured by Secondary Ion Mass Spectrometry (SIMS). The higher the concentration of the carbon doping, or the thicker the thickness of the GaN buffer layer, the greater the sheet resistance of the semiconductor epitaxial stack becomes.

After the buffer structure 30 is formed, the channel layer 40 and the barrier layer 50 are formed on the buffer structure 30 by an epitaxial method similar to the foregoing. The channel layer 40 having a thickness ranging from 50 nm to 300 nm is formed on the buffer structure 30, and includes a first energy gap. The barrier layer 50 having a thickness ranging from 20 nm to 50 nm is formed on the channel layer 40 and includes a second energy gap, wherein the second energy gap is larger than the first energy gap, and the lattice constant of the barrier layer 50 is smaller than that of the channel layer 40. In the embodiment, the material of the channel layer 40 includes $In_xGa_{(1-x)}N$, wherein $0 \leq x < 1$, and the material of the barrier layer 50 includes $Al_yIn_zGa_{(1-yz)}N$, wherein $0 < y < 1$ and $0 \leq z < 1$. The channel layer 40 itself and the barrier layer 50 itself form spontaneous polarizations. Between the barrier layer 50 and the channel layer 40, a piezoelectric polarization is created on the barrier layer 50 due to the sum of the interaction of different lattice constants between the channel layer 40 and the layers thereunder. The spontaneous polarizations and the piezoelectric polarization in turn create a two-dimensional electron gas (2DEG) at the heterojunction between the channel layer 40 and the barrier layer 50. In the embodiment, the materials of the channel layer 40 and the barrier layer 50 can include an intrinsic semiconductor without dopants. Or depending on the device characteristics, the materials of the channel layer 40 and the barrier layer 50 can include an extrinsic semiconductor which has dopants, such as silicon, to adjust the concentration of the 2DEG. In the embodiment, the buffer structure 30 includes GaN buffer layer doped with carbon and the channel layer 40 includes undoped GaN channel layer with a thickness of 200 nm, so the buffer structure 30 includes a higher sheet resistance than channel layer 40 does. The barrier layer 50 includes AlGaN layer with 20% aluminum contents and a thickness of 30 nm. It is worth noting that when the aluminum content of the barrier layer 50 is low, the polarity of the semiconductor epitaxial stack is decreased and the sheet resistance thereof is increased.

Next, the source electrode 70, the drain electrode 80, and the gate electrode 90 are separately formed on the barrier layer 50 as end points for external electrical connection. The source electrode 70 and the drain electrode 80 are respectively located at two ends of the barrier layer 50, and the gate electrode 90 is located between the source electrode 70 and the drain electrode 80. In the embodiment, the ohmic contact is formed between the source electrode 70 and the barrier layer 50 and between the drain electrode 80 and the barrier layer 50 by appropriately selecting the materials of the source electrode 70 and the drain electrode 80, and/or by treatment such as thermal annealing. Similarly, a Schottky contact or ohmic contact can be formed between the gate electrode 90 and the barrier layer 50 by appropriately selecting the material of the gate electrode 90. The materials of the source electrode 70 and the drain electrode 80 can be selected from titanium (Ti) and aluminum (Al). The material of the gate electrode 90 can be selected from nickel (Ni), gold (Au), tungsten (W), and nitride titanium (TiN).

Finally, after the electrodes are formed, the protective layer 60 is formed to cover the source electrode 70, the drain electrode 80, and the gate electrode 90, and then portions of the protective layer 60 are removed by etching to expose portions of the source electrode 70, the drain electrode 80, and the gate electrode 90, which means portions of the surfaces of the source electrode 70, the drain electrode 80, and the gate electrode 90 are not covered by the protective layer 60 to provide regions for external electrical connection. This completes the structure of the III-nitride HEMT S as shown in FIG. 3. The protective layer 60 is used to prevent the electrical property of the barrier layer 50 from being affected. The protective layer 60 can include oxide such as silicon oxide or aluminum oxide, nitride such as silicon nitride or gallium nitride or oxynitride such as silicon oxynitride. In another embodiment, the III-nitride HEMT S cannot include the protective layer 60.

It should be noted that in other embodiments, a back barrier layer (not shown) can be inserted between the buffer structure 30 and the channel layer 40. The back barrier layer includes an AlGaN layer with aluminum content higher than that of the buffer structure 30. When the semiconductor epitaxial stack 1000 is used in forming the III-nitride HEMT, the back barrier layer with aluminum content higher than that of the buffer structure 30 includes a higher energy gap to provide an ability of localizing electrons. The ability prevents electrons from entering the buffer structure 30 and being captured by the epitaxial defects therein during the HEMT operation which thereby affects the concentration stability of the 2DEG at the heterojunction during HEMT operation. That is, it is possible to reduce the degree of current collapse when the HEMT is repeatedly operated.

It should be noted that in the embodiment, in order to avoid the increase of the barrier height of the channel layer 40 caused by high energy gap of the back barrier layer from affecting the current intensity during the HEMT operation, the thickness of the back barrier layer is preferably not more than 50 nm.

As described in the embodiment, the semiconductor epitaxial stack 1000 of the III-nitride HEMT unit E1, i.e. the III-nitride HEMT S, can include a sheet resistance greater than 500 Ω/sq. In addition, the sheet resistance of the overall semiconductor epitaxial stack 1000 can also be increased by further adjusting the composition of each epitaxial layer, the proportion of elements in each epitaxial layer, the doping type of the element, or the doping concentration of the element.

Figure 5:
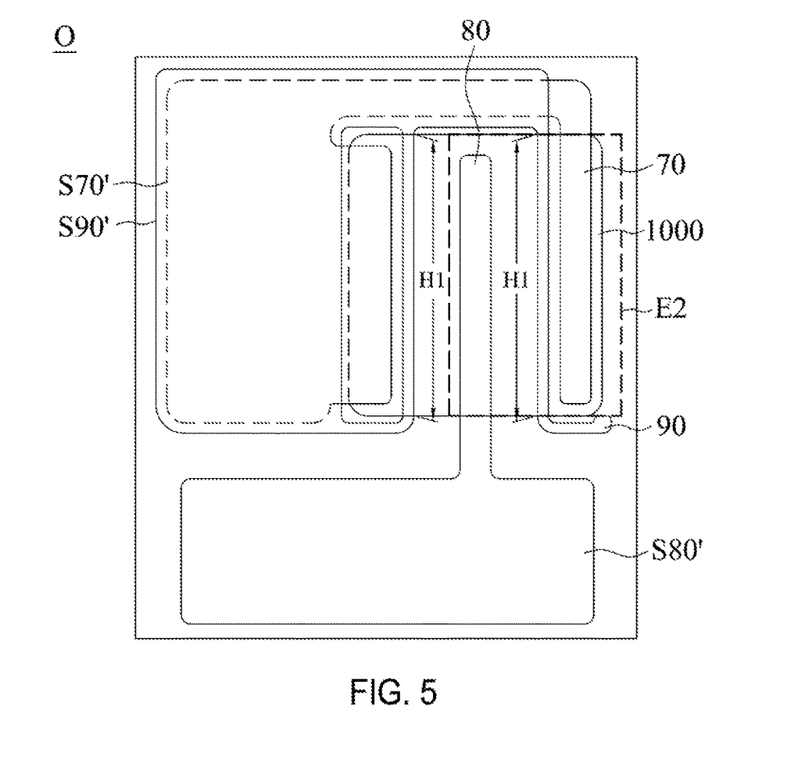
FIG. 5 shows a top view of a III-nitride HEMT in accordance with a second embodiment of the present disclosure.

Referring to FIG. 5, which shows a top view of a III-nitride HEMT O in accordance with a second embodiment of the present disclosure. As previously mentioned, the III-nitride HEMT O is a three-terminal structure. In the embodiment, the III-nitride HEMT O also includes a source pad S70', a drain pad S80', a gate pad S90', and one III-nitride HEMT unit E2 commonly formed on the aforementioned semiconductor epitaxial stack 1000. The III-nitride HEMT unit E2 includes a source electrode 70 electrically connected to the source pad S70', a drain electrode 80 electrically connected to the drain pad S80', and a gate electrodes 90 electrically connected to the gate pad S90'. In the embodiment, from the top view, the source pad S70' and the gate pad S90' are overlapped and electrically connected with each other. Compared with the source pad S70 and the gate pad S90 of the first embodiment, in the embodiment, the source pad S70' and the gate pad S90' are overlapped and electrically connected with each other to be an electrically connected structure. Therefore, the electrically connected structure can reduce the ratio of the area of the pad to the whole area of the HEMT. In another embodiment, the source pad S70' and the gate pad S90' are separated from each other.

Figure 6A:
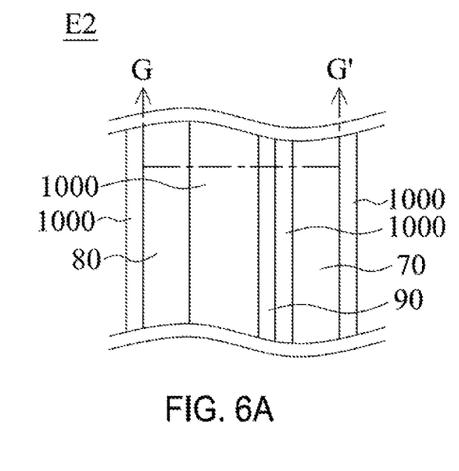
FIG. 6A shows a partial enlarged top view of the III-nitride HEMT unit in accordance with the second embodiment of the present disclosure.
Figure 6B:
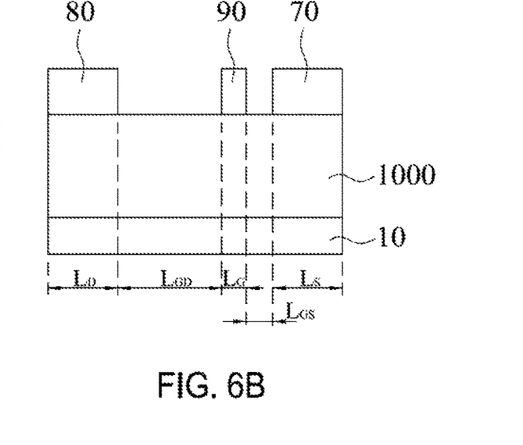
FIG. 6B shows a cross-sectional view taken along the line GG' in FIG. 6A.

FIGS. 6A and 6B show a detailed structure of a III-nitride HEMT unit E2 disclosed in the second embodiment. The detailed structure of the III-nitride HEMT O is the same as that of the III-nitride HEMT unit E2. In the embodiment, the structures similar to those of the first embodiment are denoted by the same reference numerals. FIG. 6A shows a partial enlarged top view of the III-nitride HEMT unit E2 shown in FIG. 5, and FIG. 6B shows a cross-sectional view taken along the line GG' in FIG. 6A. From the cross-sectional view, the source electrode 70 has a length $L_S$ (in the embodiment, $L_S$ is 20 μm), the drain electrode 80 has a length $L_D$ (in the embodiment, $L_D$ is 20 μm), the gate electrode 90 has a length $L_G$ (in the embodiment, $L_G$ is 9 μm), a space $L_{GS}$ (in the embodiment, $L_{GS}$ is 6 μm) exists between the source electrode 70 and the gate electrode 90, and a space $L_{GD}$ (in the embodiment, $L_{GD}$ is 15 μm) exists between the drain electrode 80 and the gate electrodes 90.

In an embodiment, the gate electrode 90 includes a total width $W_G$ (in the embodiment, $W_G$ is 280 μm) in the entire III-nitride HEMT O. The total width $W_G$ of the gate electrode is the sum of the width H1 of the gate segments of the gate electrodes 90 located on the semiconductor epitaxial stack 1000. In the embodiment, the total width $W_G$ of the gate electrode is 2H1, as shown in FIG. 5. As previously described, the semiconductor epitaxial stack 1000 in the III-nitride HEMT O has a sheet resistance greater than 500 Ω/sq. When the sheet resistance of the semiconductor epitaxial stack 1000 is 500 Ω/sq, with the structure and design shown in FIGS. 5 and 6, a breakdown voltage $V_{br}$ between the source electrode 70 and the drain electrode of the III-nitride HEMT O under turned-on in the forward direction is 250 volts.

Figure 7:
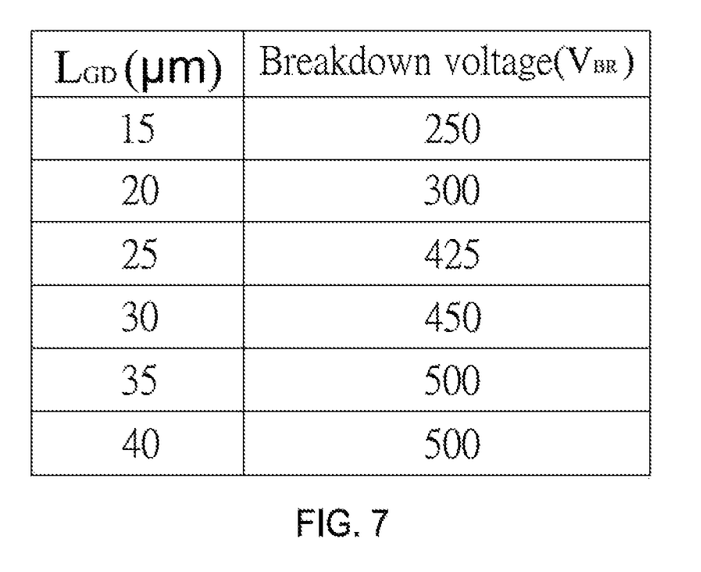
FIG. 7 shows a result table of the breakdown voltage $V_{br}$ varied with the space $L_{GD}$ of the III-nitride HEMT in accordance with the second embodiment of the present disclosure.

Then, when all the remaining structures are fixed, the breakdown voltage $V_{br}$ sustained by the III-nitride HEMT O is observed by adjusting the size of the space $L_{GD}$. Referring to the experimental results of FIG. 7, when the space $L_{GD}$ of the III-nitride HEMT O becomes large, the breakdown voltage $V_{br}$ sustained by the III-nitride HEMT O under forward operating increases. In particular, in the original structure, when the space $L_{GS}$ is fixed as 6 μm and the space $L_{GD}$ is equal to or greater than 20 μm, i.e. the value of $$\frac{L_{GD}}{L_{GS}+L_{GD}}$$

is equal to or greater than 0.77, the breakdown voltage $V_{br}$ sustained by the III-nitride HEMT O under forward operation can be higher than 300 volts. When the space $L_{GD}$ is equal to or greater than 35 μm, the breakdown voltage $V_{br}$ sustained by the III-nitride HEMT O under forward operating can be higher than 500 volts.

Figure 8A:
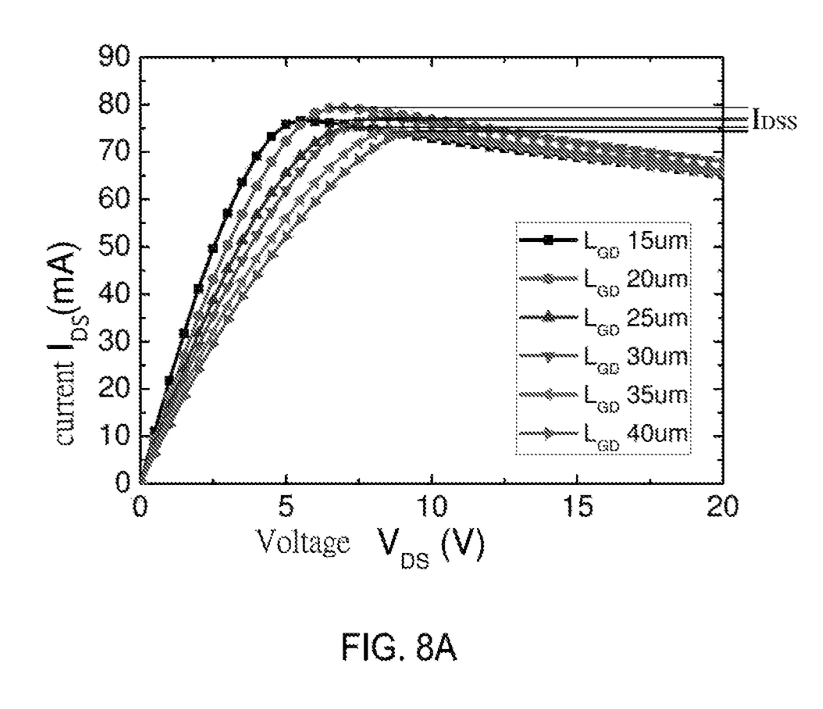
FIG. 8A shows a current-voltage curve of the III-nitride HEMT in accordance with the second embodiment of the present disclosure, which shows the variation of the drain-source current $I_{DS}$ with the drain-source voltage $V_{DS}$ when the space $L_{GD}$ is varied.
Figure 8B:
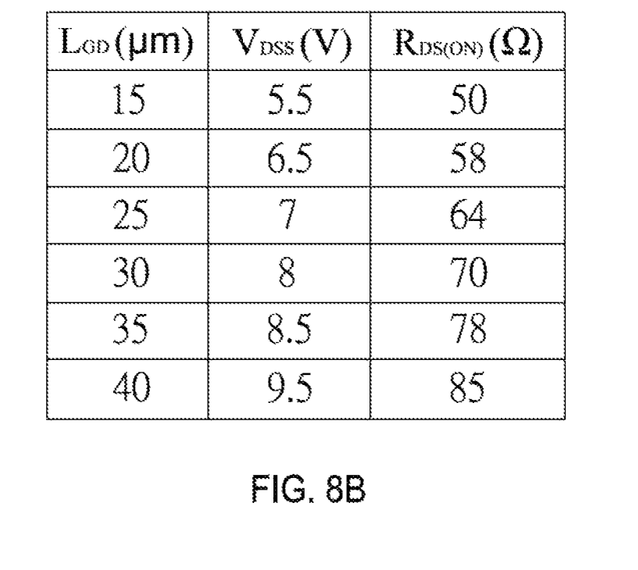
FIG. 8B shows a result table of the saturation voltage $V_{DSS}$ and the on-resistance $R_{DS(ON)}$ varied with the space $L_{GD}$ of the III-nitride HEMT in accordance with the second embodiment of the present disclosure.

Referring to FIGS. 8A to 8B, FIG. 8A shows a current-voltage curve of the III-nitride HEMT O in accordance with the second embodiment of the present disclosure, which shows the variation of the drain-source current IDS with the drain-source voltage $V_{DS}$ when the space $L_{GD}$ is varied. FIG. 8B shows a result table in accordance with the results of FIG. 8A. In FIG. 8A, different lines represent the measurement results under different space $L_{GD}$ conditions. From the experimental results, as the space $L_{GD}$ increases, the on-resistance $R_{DS(ON)}$ of the III-nitride HEMT O increases. Here, $R_{DS(ON)}$ is calculated by dividing the voltage VDS from 0V to 2.5V by the current value before reaching the saturation region when the transistor O is turned on, that is, the reciprocal of the slope of the measurement line before the saturation region. Therefore, the saturation voltage $V_{DSS}$ of the III-nitride HEMT O increases as the space $L_{GD}$ increases.

Referring to FIGS. 7 to 8B, in the embodiment, the breakdown voltage $V_{br}$ of the III-nitride HEMT O can be reached to 500 volts or more by adjusting the space $L_{GD}$. However, when the space $L_{GD}$ is equal to 35 μm or to 40 μm, the on-resistance $R_{DS(ON)}$ of the III-nitride HEMT O rises to 78Ω or to 85Ω, and the saturation voltage $V_{DSS}$ thereof also rises to 8.5 volts or to 9.5 volts. Compared with other smaller space $L_{GD}$, a higher drain-source voltage $V_{DS}$ must be applied on the III-nitride HEMT O when operating in the saturation region.

Referring to FIG. 1, if the III-nitride HEMT O of the present disclosure is implemented in a lighting system, in addition to maintaining the lighting system capable of sustaining high breakdown voltages, the HEMT also needs to operate in the saturated region to stabilize the output of the drain-source current $I_{DS}$. Therefore when the III-nitride HEMT O has a higher saturation voltage $V_{DSS}$, the operating range of the drain-source voltage $V_{DS}$ thereof is relatively reduced.

Figure 9A:
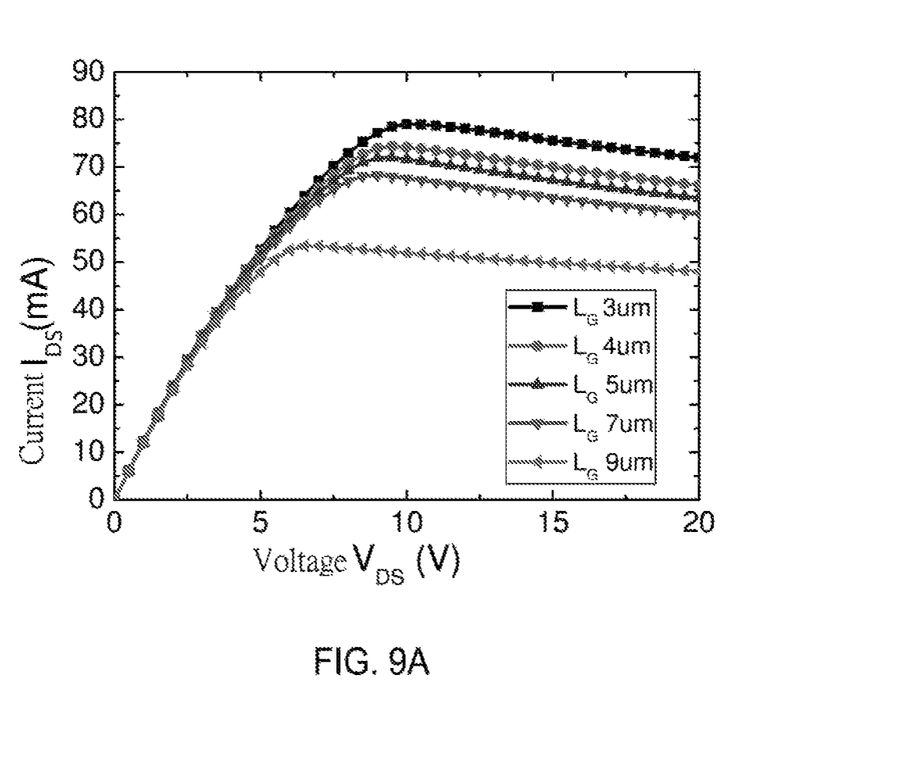
FIG. 9A shows a current-voltage curve of the III-nitride HEMT in accordance with the second embodiment of the present disclosure, which shows the variation of the drain-source current $I_{DS}$ with the drain-source voltage $V_{DS}$ when the length $L_G$ is varied.
Figure 9B:
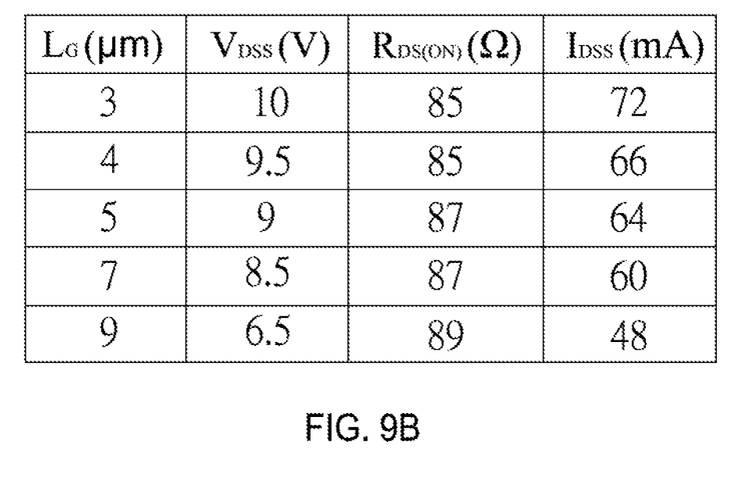
FIG. 9B shows a result table of the saturation voltage $V_{DSS}$, the on-resistance $R_{DS(ON)}$ and the saturation current $I_{DSS}$ varied with the length $L_G$ of the III-nitride HEMT in accordance with the second embodiment of the present disclosure.

Referring to FIGS. 9A and 9B, the above experimental results show that selecting the $L_{GD}$ greater than 35 μm can render the breakdown voltage of the HEMT greater than or equal to 500 volts. If the preferred operating range of the drain-source voltage $V_{DS}$ also needs to be satisfied, the magnitude of the saturation voltage $V_{DSS}$ of the HEMT can be adjusted by changing the length $L_G$ of the gate electrode so as to widen the operating voltage range of the saturated region of the HEMT. FIG. 9A shows a current-voltage curve of the III-nitride HEMT O in accordance with the second embodiment of the present disclosure, which shows the variation of the drain-source current $I_{DS}$ with the drain-source voltage $V_{DS}$ when the length $L_G$ is varied but the space $L_{GD}$ is 40 μm and the remaining structure is fixed. FIG. 9B shows a result table in accordance with the results of FIG. 9A. In FIG. 9A, different lines represent the measurement results under different length $L_G$ conditions. From the experimental results, as the length $L_G$ increases, the on-resistance $R_{DS(ON)}$ of the III-nitride HEMT O maintains unchanged, but the saturation voltage $V_{DSS}$ decreases. In this way, by adjusting the length $L_G$ and unchanging the on-resistance $R_{DS(ON)}$, the operating voltage range of the HEMT O in the saturation region also increases as the saturation voltage $V_{DSS}$ decreases. Referring to FIG. 9B, when the length $L_G$ is 9 μm, the saturation voltage $V_{DSS}$ can be reduced to less than 6.5 volts. It can be expected that when the length $L_G$ of the gate electrode is larger, the saturation voltage $V_{DSS}$ can be lower. According to the experimental results, when the length $L_G$ of the gate electrode increases, the saturation voltage $V_{DSS}$ of the HEMT decreases and the saturation current $I_{DSS}$ thereof also decreases. In another embodiment, the current path in the HEMT can be increased by increasing the total width $W_G$ of the gate electrode in the HEMT, thereby increasing the saturation current $I_{DSS}$ thereof.

From the measured results in FIG. 9A, in the saturation region of the III-nitride HEMT O, the drain-source current $I_{DS}$ is slightly declined as the drain-source voltage $V_{DS}$ increases. When the III-nitride HEMT of the present disclosure replaces the silicon-based transistor element in FIG. 1, the overall output power of the lighting system can be close to a constant value so that the lighting system can save energy.

Figure 10:
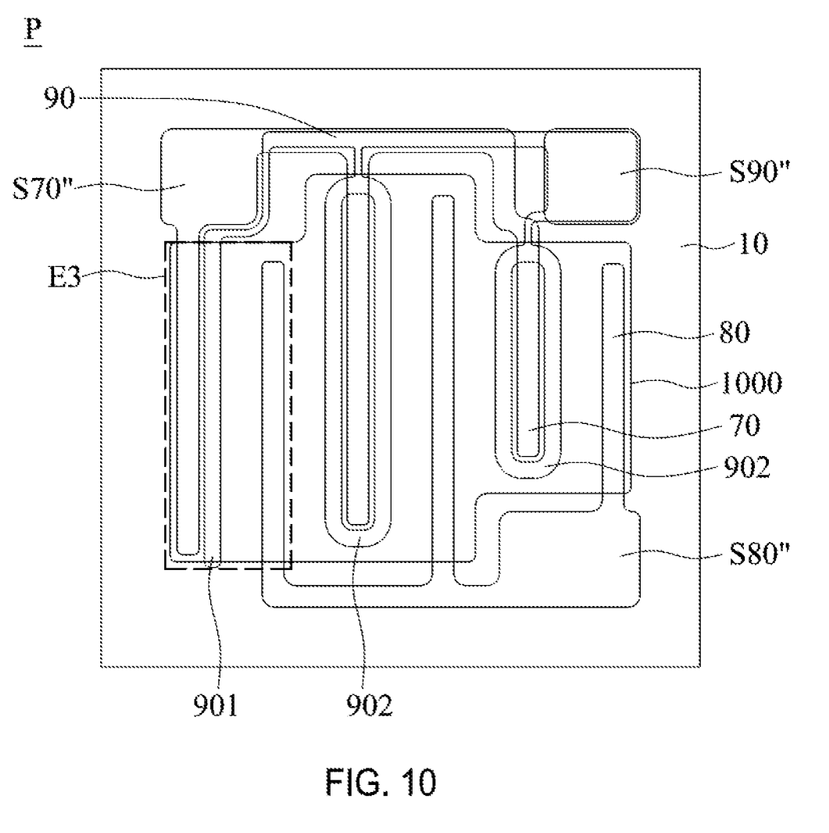
FIG. 10 shows a top view of a III-nitride HEMT in accordance with the third embodiment of the present disclosure.

FIG. 10 shows a top view of a III-nitride HEMT P in accordance with the third embodiment of the present disclosure. As previously mentioned, the III-nitride HEMT P is a three-terminal structure. In the embodiment, the III-nitride HEMT P also includes a semiconductor epitaxial stack 1000, a source pad S70", a drain pad S80", a gate pad S90", and a source electrode 70, a drain electrode 80, a gate electrode 90 including a gate electrode segment 901 with a strip end and two gate electrode segments 902 with a ring end, and one III-nitride HEMT unit E3. The source electrode 70 electrically connects to the source pad S70", the drain electrode 80 electrically connects to the drain pad S80", and the gate electrodes 90 electrically connects to the gate pad S90. In the embodiment, in order to make the HEMT P have greater saturation current $I_{DSS}$ without changing other electrical characteristics, the total width of the gate electrode segments 901 and 902 can be extended as much as possible on the surface of the semiconductor epitaxial stack 1000 of the III-nitride HEMT P without changing other configurations thereof. Thus, from the top view, the gate electrode segments 901 and 902 extending from the gate pad S90" include end of a straight-line type and a hollow-closed-area type (ring), respectively. The current path is increased by the ring-type gate electrode segment 902. The corresponding source electrode 70 is located inside the hollow enclosed area of the gate electrode segment 902 and on a side of the strip gate electrode segment 901, and the drain electrode 80 is located outside the gate electrode segment 902 and on another side of the strip electrode segment 901.

Figure 11A:
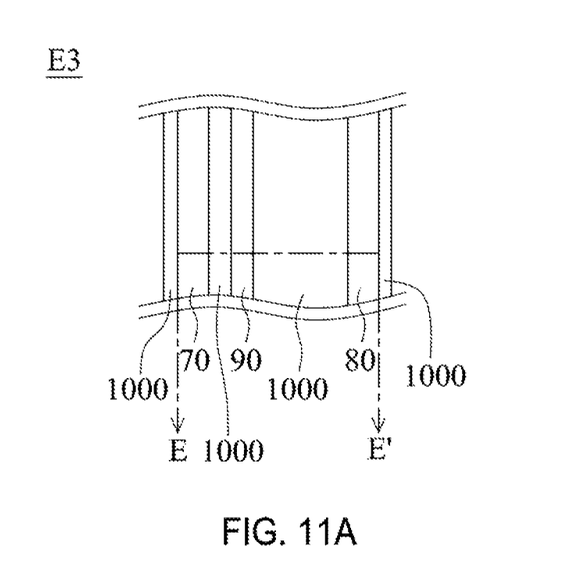
FIG. 11A shows a partial enlarged top view of the III-nitride HEMT unit in accordance with the third embodiment of the present disclosure.
Figure 11B:
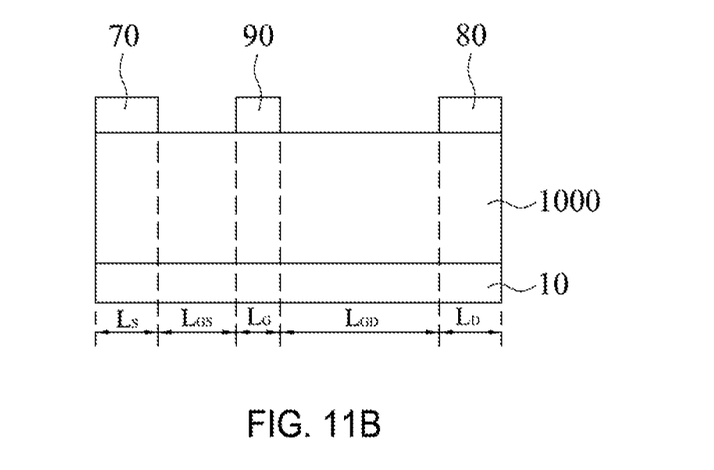
FIG. 11B shows a cross-sectional view taken along the line EE' in FIG. 11A.

FIGS. 11A and 11B show a detailed structure of the III-nitride HEMT unit E3 in accordance with the third embodiment of the present disclosure. The detailed structure of the III-nitride HEMT P is the same as that of the III-nitride HEMT unit E3. In the embodiment, the structures similar to those of the first embodiment are denoted by the same reference numerals. FIG. 11A shows a partial enlarged top view of the III-nitride HEMT unit E3 shown in FIG. 10. FIG. 11B shows a cross-sectional view taken along the line EE' in FIG. 11A. From the cross-sectional view, the source electrode 70 includes a length $L_S$ (in the embodiment, $L_S$ is 20 µm), the drain electrode 80 includes a length $L_D$ (in the embodiment, $L_D$ is 20 µm), the gate electrode 90 includes a length $L_G$ (in the embodiment, $L_G$ is 11 µm), a space $L_{GS}$ (in the embodiment, $L_{GS}$ is 6 µm) exists between the source electrode 70 and the gate electrode 90, and a space $L_{GD}$ (the embodiment, $L_{GD}$ is 35 µm) exists between the drain electrode 80 and the gate electrode 90.

In an embodiment, the gate electrode 90 includes a total width $W_G$ in the entire III-nitride HEMT P. In the embodiment, the total width $W_G$ of the gate electrode segments 901 and 902 on the surface of the semiconductor epitaxial stack 1000 is 1010 µm. As previously described, the semiconductor epitaxial stack 1000 in the III-nitride HEMT P includes a sheet resistance greater than 500 Ω/sq. When the sheet resistance of the semiconductor epitaxial stack 1000 is 500 Ω/sq, with the structure and design shown in FIGS. 10 and 11, the HEMT P can obtain a saturation voltage $V_{DSS}$ less than 6 volts and a breakdown voltage $V_{br}$ greater than 500 volts, and include a saturation current $I_{DSS}$ higher than 100 mA.

With the disclosed embodiments, an III-nitride HEMT with good current characteristics and high voltage resistance can be formed, which includes industrial applicability. The embodiments described above are only for illustrating the technical ideas and characteristics of the present disclosure, and the purpose thereof is to enable those skilled in the art to understand the contents of the present disclosure and implement them accordingly, and not limiting the scope of the claim of the present disclosure. The equivalent change or modification made according to the spirit disclosed in the present disclosure should still be covered by claim of the present disclosure.

What is claimed is:

1. A III-nitride high electron mobility transistor (HEMT), comprising:
   a substrate;
   a semiconductor epitaxial stack, formed on the substrate, comprising:
      a buffer structure;
      a channel layer, formed on the buffer structure; and
      a barrier layer, formed on the channel layer, wherein a two-dimensional electron gas is formed between the channel layer and the barrier layer; and
   a first electrode, a second electrode and a third electrode, respectively formed on the barrier layer, wherein the second electrode is located between the first electrode and the third electrode,
   wherein the semiconductor epitaxial stack comprises a sheet resistance greater than 500 Ω/sq,
   wherein there is a first minimum space between the first electrode and the second electrode, a second minimum space between the second electrode and the third electrode, and the first minimum space and the sum of the first minimum space and the second minimum space comprises a ratio greater than or equal to 0.77 and less than 1,
   wherein the second electrode comprises a length greater than or equal to 9 µm.

2. The III-nitride HEMT of claim 1, wherein the second minimum space is greater than or equal to 20 µm.

3. The III-nitride HEMT of claim 1, wherein the HEMT comprises a saturation voltage less than 6.5 volts.

4. The III-nitride HEMT of claim 1, wherein the HEMT comprises a breakdown voltage greater than 500 volts.

5. The III-nitride HEMT of claim 1, wherein the III-nitride HEMT is a normally-on III-nitride HEMT.

6. The III-nitride HEMT of claim 1, wherein from a top view, the second electrode comprises at least two ends, and the at least two ends comprise a straight line and a hollow closed area.

7. The III-nitride HEMT of claim 6, wherein from the top view, the third electrode is located at the hollow closed area.

8. The III-nitride HEMT of claim 1, wherein the buffer structure comprises a super-lattice stack, and wherein the buffer structure is closer to the substrate than the channel layer, and the buffer structure comprises a higher sheet resistance than the channel layer does.

9. The III-nitride HEMT of claim 8, wherein the semiconductor epitaxial stack comprises a back barrier layer between the buffer structure and the channel layer.

10. The III-nitride HEMT of claim 9, wherein the back barrier layer comprises a thickness less than 50 nm.

* * * * *